United States Patent [19]

Caillet et al.

[11] Patent Number: 5,095,537
[45] Date of Patent: Mar. 10, 1992

[54] AUTOMATIC MONITORING SYSTEM IN AN EXPLOSIVE ENVIRONMENT OF A DIRECT CURRENT SOURCE BY STORAGE BATTERIES

[75] Inventors: Pierre Caillet, Goncelin; Robert Jean, Seyssins; Serge Laffont, Fontaine; Michel Prunier, Domene; Philippe Trichet, Grenoble, all of France

[73] Assignee: Merlin Gerin, Meylan, France

[21] Appl. No.: 696,295

[22] Filed: Apr. 29, 1991

Related U.S. Application Data

[63] Continuation of Ser. No. 389,337, Aug. 3, 1989, abandoned.

[30] Foreign Application Priority Data

Aug. 17, 1988 [FR] France .................. 8811018

[51] Int. Cl.⁵ .................. G01N 27/416; H04B 17/00
[52] U.S. Cl. .................. 455/66; 324/432; 324/434; 340/636; 455/67
[58] Field of Search .................. 455/67, 66, 115, 127, 455/226, 343; 340/636; 324/432, 434

[56] References Cited

U.S. PATENT DOCUMENTS

| | | | |
|---|---|---|---|
| 3,599,094 | 8/1971 | Pring | 324/434 |
| 3,818,325 | 6/1974 | Boshers | 324/434 |
| 3,986,498 | 10/1976 | Lewis | 428/2.06 R |
| 4,217,645 | 8/1980 | Barry et al. | 364/483 |
| 4,247,811 | 1/1981 | Findl | 320/35 |
| 4,280,097 | 7/1981 | Carey et al. | 324/434 |
| 4,590,466 | 5/1986 | Wiklund et al. | 340/870.28 |
| 4,866,428 | 9/1989 | Hinkle | 340/636 |

FOREIGN PATENT DOCUMENTS

| | | |
|---|---|---|
| 3201758 | 8/1983 | Fed. Rep. of Germany . |
| 2427817 | 4/1980 | France . |
| 2139829 | 11/1984 | United Kingdom . |

Primary Examiner—Reinhard J. Eisenzopf
Assistant Examiner—Chi Pham
Attorney, Agent, or Firm—Parkhurst, Wendel & Rossi

[57] ABSTRACT

An automatic monitoring system of storage batteries housed in battery rooms comprises an acquisition satellite associated with a sensor to measure various physical parameters representative of the operating state of a pilot battery cell, notably the density, temperature and electrolyte level, a data concentrator located outside the corresponding battery room and arranged to communicate by radioelectric waves with the acquisition satellite, and a centralized processing unit connected to the concentrator by a two-way cabled communication network.

6 Claims, 2 Drawing Sheets

AUTOMATIC MONITORING SYSTEM IN AN EXPLOSIVE ENVIRONMENT OF A DIRECT CURRENT SOURCE BY STORAGE BATTERIES

This is a continuation of application Ser. No. 07/389,337, filed Aug. 3, 1989, now abandoned.

BACKGROUND OF THE INVENTION

The invention relates to an automatic monitoring system of a direct current source by storage batteries housed in battery rooms located at a certain distance from a centralized processing unit associated with a display screen to indicate the charge and capacity available per battery and to converse with the operator, the system comprising monitoring means of certain physical parameters representative of the operating state of all the battery cells or of certain pilot cells in each battery, notably the density, temperature, and electrolyte level contained in said pilot cell, and the voltage of this cell.

In submarines with conventional or nuclear propulsion, one or two batteries provide the propulsion and the electrical power supply of the immersed submarine (conventional propulsion) or in back-up mode (nuclear propulsion).

A submarine battery is made up of a plurality of cells, electrically connected in series.

The batteries are arranged in several rows in one or two battery rooms in the forward and aft parts of the submarine.

Each battery room is in the form of a leaktight room, in depression, and ventilated to eliminate the hydrogen given off by the batteries during the charging and discharging cycles. The battery room constitutes an explosible environment, which can become explosive, under abnormal operating conditions (ventilation stopped . . . ).

The submarine commander must be able on the one hand to regularly estimate the remaining capacity of its battery, so as to use it as best as possible according to the circumstances, and on the other hand to monitor the state of the battery to detect faulty cells.

These two functions, charge estimation and battery monitoring, require frequent checking of different parameters representative of the state of the battery, notably:
- the electrolyte density of certain pilot cells
- the electrolyte temperature of these cells
- the electrolyte level of these cells
- the voltage of these cells.

At present, a sailor goes down into battery room several times a day; dressed in overalls, gloves and glasses to protect him against acid projections, he crawls across the battery covers to weigh the acid, measure the temperature and the level of certain pilot cells.

It is state-of-the-art to replace this human checking by intermittent local rounds by an automatic monitoring system of the battery parameters (see U.S. Pat. No. 4,280,097). A device of this kind requires connecting cables between the batteries and the data concentrators, which complicates maintenance in the battery room and does not lend itself to modularity of the architecture.

SUMMARY OF THE INVENTION

The object of the invention consists in reducing the dimensions and in performing the reliability, safety and maintainability of an automatic battery monitoring system.

It furthermore consists in designing a modular system enabling the number of cells to be monitored per battery to be selected.

The monitoring system according to the invention is characterized in that the monitoring and communication means comprise:

an acquisition satellite per monitored cell, connected to a sensor plunged into the electrolyte to measure the parameters of this cell, the satellite being housed inside the corresponding battery room, and being electrically system-powered by the voltage present at the terminals of opposite polarity of the cell, a data concentrator, located outside said room and arranged to communicate on the one hand by waves with the acquisition satellite of each monitored cell, and on the other hand with the centralized processing unit via a cabled network.

The power supply to an acquisition satellite is achieved automatically from the DC voltage (2 Volts) of the cell to which it is assigned. The role of the satellite consists in performing measurement of the parameters of this cell, and in transmitting them outside the battery room via a concentrator to a central unit equipped with a display screen and located in the control room. The measurements will be processed in this unit to compute the charge and remaining capacity of the battery, and to trigger alarms and perform other processing operations.

The wireless transmission system by waves between the concentrator and satellites can be achieved by radioelectric waves. The choice of communication by radioelectric waves between the satellites and the data concentrator presents the following advantages:

small dimensions and ease of maintenance of the equipment inside the battery room, due to the absence of cables;

very easy adaptation of the system to all submarine batteries;

no limit to the number of satellites in each room;

low power consumption of the transmission circuits equipping the satellites.

The acquisition satellite comprises a transmission board with a transceiver circuit equipped with a first antenna capable of sending measurement data to the concentrator and of receiving orders coming from the latter. Radio transmission between the acquisition satellite and the concentrator is achieved for example by VHF waves and frequency modulation.

The data concentrator of each battery room comprises a data multiplexer circuit, and a transmission board with a transceiver circuit connected to a second antenna located inside the battery room, a connecting cable passing through the battery room wall to connect the concentrator to the second antenna. The wall advantageously comprises an insulating shield constituting a Faraday cage allowing only internal radio transmission between the respective first and second antennae of the satellite and the concentrator.

The acquisition satellites and the sensor constitute safety assemblies in an explosive environment by application of protection modes by built-in safety and/or encapsulation.

The wireless transmission system may also be of the optic type, for example by infrared.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
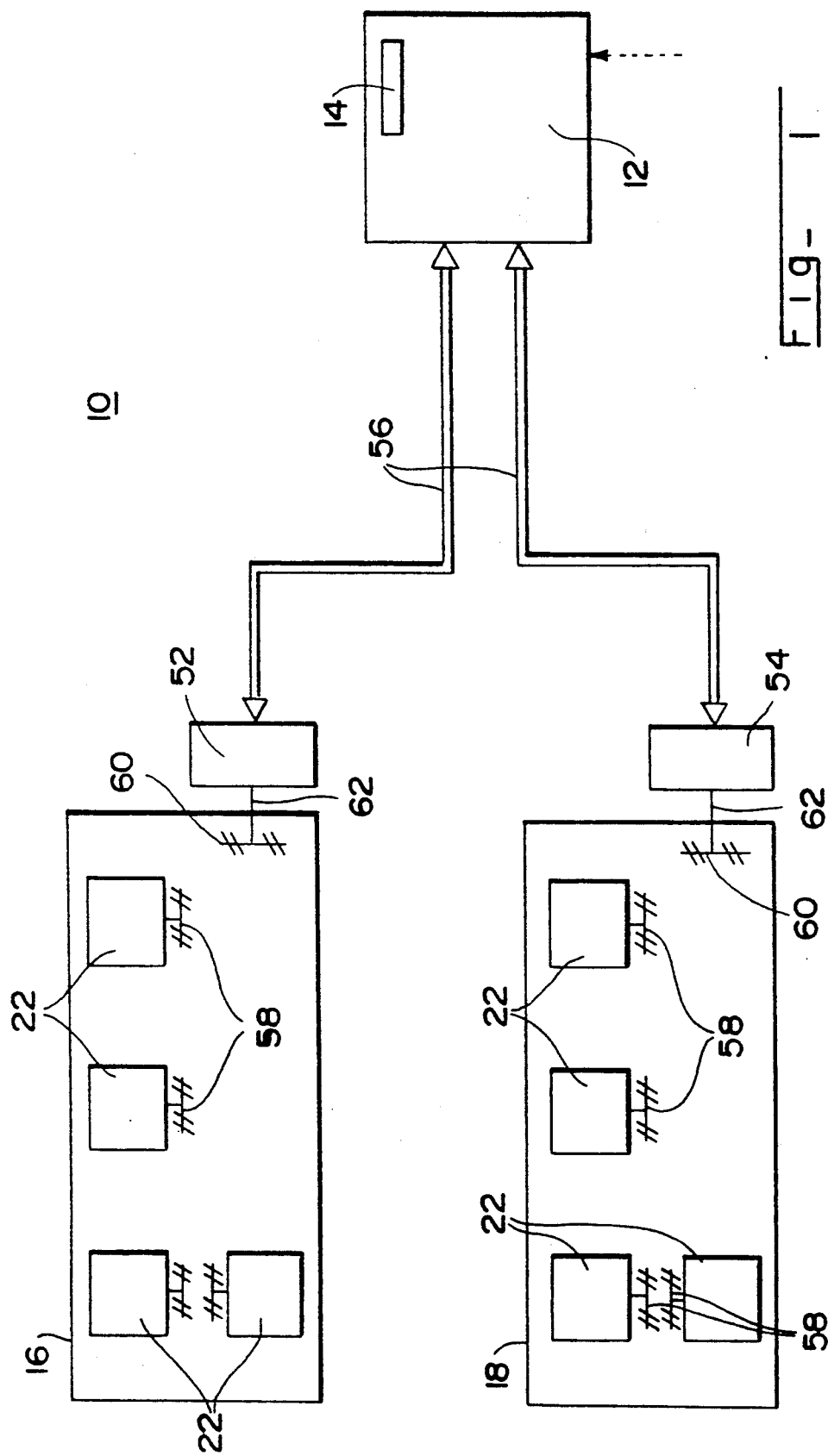
FIG. 1 is a block diagram of an automatic monitoring system of two storage batteries.

In FIG. 1, an automatic monitoring system 10 of a direct current source by storage batteries is equipped with a centralized processing unit 12 with a display screen 14 to compute and indicate the charge and capacity available per battery, and to monitor certain physical parameters representative of the operating condition of the batteries, notably the density, temperature and electrolyte level inside each battery cell, or inside certain pilot cells. The processing unit 12 can be located in the control and operating room of a submarine, whereas each storage battery is housed in a battery room 16, 18 at a certain distance from the central unit 12. FIG. 1 shows, as an example, two battery rooms 16, 18 located forward and aft of the submarine, but the number of rooms may naturally be different depending on the space available and on the weight distribution of the batteries.

Figure 2:
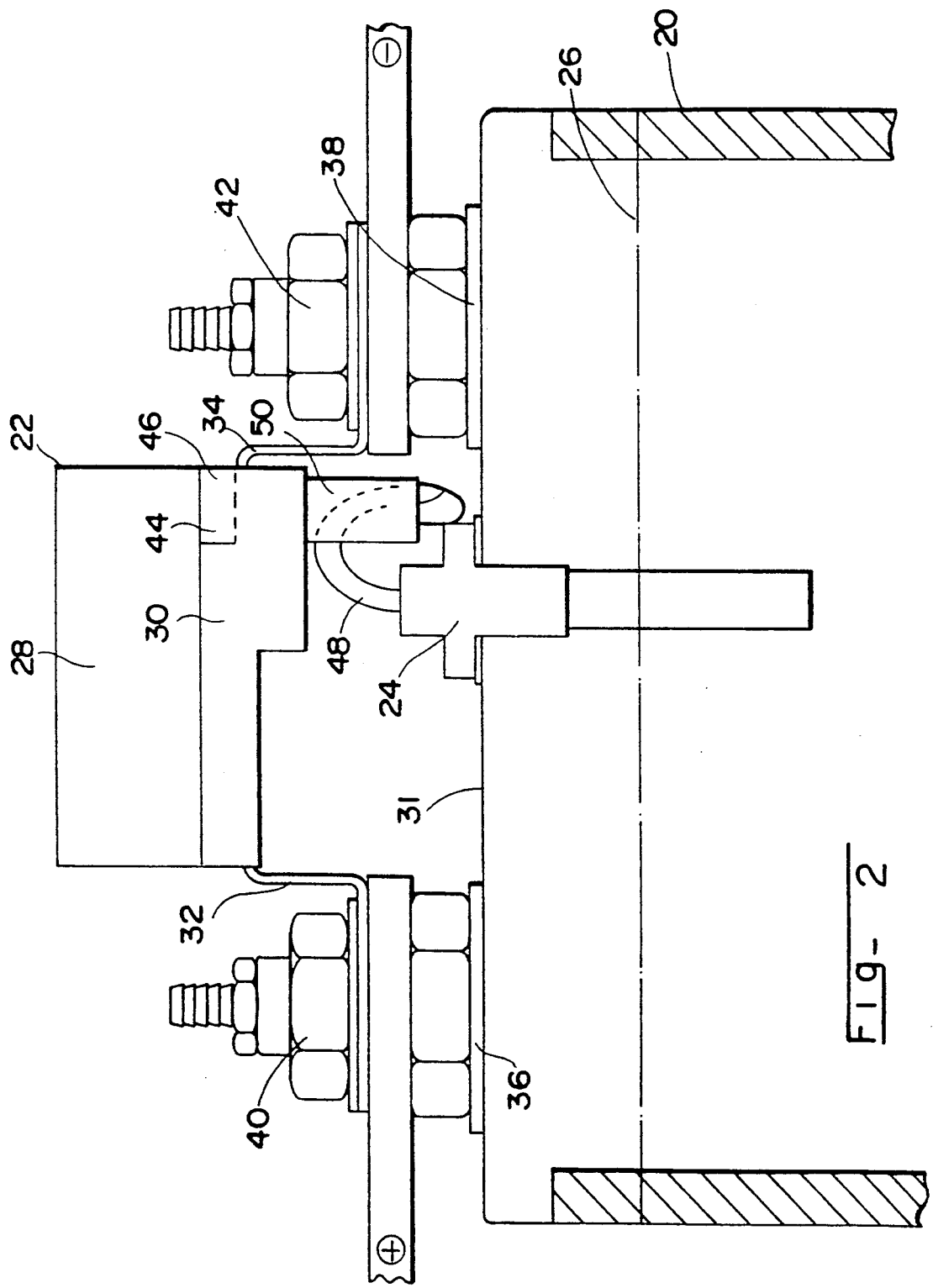
FIG. 2 shows a partial view of a pilot cell equipped with a parameter monitoring assembly by satellite and measurement sensor assembly.

Each pilot cell 20 (FIG. 2) has associated with it an acquisition satellite 22 designed to measure the physical parameters by means of a measurement sensor assembly 24 having different measurement probes plunged into the electrolyte. The level 26 of the electrolyte is represented by the dashed line in FIG. 2. The acquisition satellite 22 is formed by two juxtaposed sub-assemblies comprising, at the top, an enclosure 28 housing printed circuit boards, notably for measurement, transmission and power supply, and at the bottom, a support block 30 made of insulating material fixed onto the cover 31 of the battery. The enclosure 28 is secured to the support block 30 by means of a mechanical fixing system which can be disassembled (not shown). The support block 30 comprises electrical connecting conductors 32, 34 directly connected to the connection terminals 36, 38 of opposite polarity of the battery cell 20 by means of fastening nuts 40, 42. The enclosure 28 is provided with two pins 44, 46 designed to plug into the support block 30, in such a way as to branch off a power supply for the printed circuit boards of the enclosure 28 from the voltage present between the connection terminals 36, 38 of the battery. The acquisition satellite 22 is thus system-powered by the voltage delivered by the battery cell 20, this voltage being in the order of 2 Volts and capable of varying between 1.7 Volts and 2.7 Volts. The satellite 22 is located above the sensor 24 in the space between the two battery terminals 36, 38.

The electrical connection of the sensor 24 with the acquisition satellite 22 is achieved by means of a sheathed flexible conductor 48 associated with a connector 50, which can be disassembled only when the enclosure 28 is uncoupled from the support block 30, and therefore from the power supply source. The sensor 24 passes tightly through the cover 31 of the battery.

In FIG. 1, the different acquisition satellites 22 are housed on the associated battery cells in the battery rooms 16, 18, each satellite 22 being equipped with a transmission board comprising a transceiver circuit designed to communicate by radio frequencies with a data concentrator 52, 54 formed by a multiplexer circuit. The concentrator 52, 54 is located outside the corresponding battery room 16, 18, for example on the outside wall of the room, and is fitted with a transmission board with a transceiver circuit, responsible for collecting all the data emitted by the acquisition satellites 22. The concentrator 52, 54 transmits the data collected to the centralized processing unit 12 by means of a two-way communication bus network 56. The transmission boards of the concentrator and of the acquisition satellites 22 are naturally tuned to the same radio frequency.

Each acquisition satellite 22 is fitted with a small antenna 58 integrated in the enclosure 28 to perform either transmission of the measurement data to the corresponding concentrator 52, 54, or receipt of orders coming from said concentrator. Communication by radioelectric wave is performed between the small antenna 58 of each acquisition satellite 22 and a large common antenna 60 of the associated concentrator 52, 54. The large antenna 60 is located inside the battery room 16, 18 and is connected to the external concentrator 52, 54 by a connecting cable 62 passing through the wall of the battery room 16, 18. This wall advantageously constitutes an insulating shield forming a Faraday cage arranged to allow internal radio transmission between the antennae 58, 60, and to prevent any radio communication with the outside of the battery room 16, 18. Radio communication takes place by VHF waves and frequency modulation.

The solutions retained make the acquisition satellite totally independent. It is therefore possible to change pilot cell by moving the acquisition satellite. In addition, the sensor assembly and the acquisition satellite enclosure can be replaced separately.

The centralized processing unit 12 collects and processes the data from the two concentrators 52, 54 via the network 56, and converses with the operator.

Operation of the monitoring system according to FIG. 1 is as follows:

The parameters representative of the state of a cell are measured and sent by the measurement sensor assembly 24 to the acquisition satellite 22, which first performs numerical processing of these measurements followed by their transmission to the associated concentrator 52, 54. This data transmission by radio between the two antennae 58, 60 of one room 16, 18 is performed after questioning the concentrator 52, 54, followed by recognition of the questioned acquisition satellite 22. The concentrator 52, 54 then retransmits this data set to the centralized processing unit 12 via the communication network 56. After computation, the parameters and other specific battery operation measurements can be displayed on the display screen 14 in the control room.

Given the possibility of an explosive environment due to the presence of hydrogen and oxygen in the ventilated battery room 16, 18, each acquisition satellite 22 is protected against the dangers of explosion either by built-in safety, or by encapsulation. The design of each acquisition satellite 22 provides for this purpose a predetermined insulation distance between certain components and insertion of a resistance in all the electrical connections, notably the connecting conductors 32, 34, to limit the currents in the event of short-circuits at the output points of the satellite 22. These two precautions prevent any spark or any thermal effect, of sufficient energy to cause inflammation of an explosive atmosphere. For certain heavy-duty operating conditions, the enclosure 28 of each acquisition satellite 22 can be filled with a pulverulent material, or be embedded by encapsulation in a compound.

The battery monitoring system 10 can naturally be used for other non-military applications, notably on vessels or in electrical power stations.

According to an alternative embodiment, the wireless transmission system between the concentrator and the acquisition satellites can operate by optic waves, notably infra-red. The satellites and concentrator of each room are then respectively equipped with an emitter diode and a photosensitive receiver diode.

I claim:

1. An automatic monitoring system for monitoring the condition of a plurality of batteries based on predetermined parameters representative of the operating state of at least one pilot cell of each battery, said parameters including at least one of the density, temperature, cell voltage, and electrolyte level contained in said pilot cell, said monitoring means comprising:

an insulation shield enclosure constituting a Faraday cage surrounding said plurality of batteries;

a plurality of sensors removably located in the electrolytes of corresponding pilot cells for detecting at least one of said parameters, an acquisition satellite detachably coupled to each of the sensors, each acquisition satellite including a measurement circuit electrically connected to said sensor by a connection conductor and a transmission circuit coupled to the measurement circuit, said measurement circuit providing a data signal in response to the detection of at least one of said parameters by the sensor coupled to the acquisition satellite, connection means for electrically and detachably connecting each acquisition satellite to terminals of opposite polarity of the pilot cell in which the sensor coupled to the acquisition satellite is located so as to use the pilot cell as a power supply for the acquisition satellite, including the measurement and transmission circuits thereof, and/or the sensor, a data concentrator comprising a data multiplexer circuit located outside said insulation shield enclosure and a processing unit, a data processor located outside said insulation shield enclosure coupled to said data concentrator via a bidirectional communication bus, said data processor including a display unit;

a wave transmission system for transmitting the data signal between the transmission circuit of each acquisition satellite and the data concentrator and for transmitting order signals, coming from the processing unit to the concentrator via said bidirectional communication bus, from the data concentrator to each acquisition satellite.

2. An automatic monitoring system according to claim 1, wherein the acquisition satellite is provided with protective means by built-in safety and/or by encapsulation enabling the system to be used in an explosive environment.

3. An automatic monitoring system according to claim 1, wherein said transmission system operates by radioelectric waves and includes a first transceiver circuit arranged in the transmission circuit of the acquisition satellite, a first antenna coupled to the first transceiver circuit for sending and receiving signals, a second transceiver circuit arranged in a transmission circuit of the data concentrator, a second antenna located inside the insulation shield enclosure, and coupled to said second transceiver circuit by a connecting cable passing through the insulation shield enclosure so as to connect the second transceiver circuit to the second antenna.

4. An automatic monitoring system according to claim 3, said acquisition satellite comprising two juxtaposed sub-assemblies having an enclosure including said measurement and transmission circuits, a support block made of insulating material fixed onto the cover of the battery, a removable mechanical fixing device, and a plug-in electrical connection by pins between the enclosure and the support block.

5. An automatic monitoring system according to claim 4, wherein a flexible conductor connects said sensor to the acquisition satellite, said conductor having a connector which is disconnectable when the enclosure is uncoupled from the support block.

6. An automatic monitoring system according to claim 1, wherein said transmission system operates by infrared waves.

* * * * *